United States Patent [19]

Sugimoto

[11] Patent Number: 5,555,234
[45] Date of Patent: Sep. 10, 1996

[54] DEVELOPING METHOD AND APPARATUS

[75] Inventor: Kenji Sugimoto, Kyoto, Japan

[73] Assignee: Dainippon Screen Mfg. Co., Ltd., Kyoto, Japan

[21] Appl. No.: 379,811

[22] Filed: Jan. 27, 1995

[30] Foreign Application Priority Data

Feb. 17, 1994 [JP] Japan .................. 6-045075

[51] Int. Cl.$^6$ .................. G03D 3/02; G03D 5/00
[52] U.S. Cl. .................. 354/317; 354/325; 216/84
[58] Field of Search .................. 354/317, 324, 354/325, 328; 355/43, 45, 53; 156/626, 637–639, 345; 118/401, 637, 410, 429, 612, 50, 53, 54; 427/88, 96, 57, 402, 420; 134/153, 33, 181, 184, 149

[56] References Cited

U.S. PATENT DOCUMENTS

| | | | |
|---|---|---|---|
| 4,326,553 | 4/1982 | Hall | 134/153 |
| 4,544,446 | 10/1985 | Cady | 156/639 |
| 4,647,172 | 3/1987 | Batchelder et al. | 354/298 |
| 5,078,832 | 1/1992 | Tanaka | 156/639 |
| 5,100,476 | 3/1992 | Mase et al. | 134/184 |
| 5,294,505 | 3/1994 | Kamon | 430/3 |

FOREIGN PATENT DOCUMENTS

| | | |
|---|---|---|
| 55-96944 | 7/1980 | Japan . |
| 57-136646 | 8/1982 | Japan . |
| 2-38441 | 10/1990 | Japan . |
| 3-136232 | 6/1991 | Japan . |

*Primary Examiner*—D. Rutledge
*Attorney, Agent, or Firm*—Lowe, Price, LeBlanc & Becker

[57] ABSTRACT

A desired pattern is exposed to a substrate surface having a photosensitive resin film formed thereon, and thereafter a prewetting liquid and a developer are successively supplied to the substrate surface. A diaphragm mounted in a prewetting liquid supply nozzle applies ultrasonic vibration to the prewetting liquid to be supplied to the substrate surface. The ultrasonic vibration applied vibrates minute bubbles of several micrometers in size which are generated when the prewetting liquid is supplied to the substrate surface, thereby causing the bubbles to float to the surface of the prewetting liquid and disappear therefrom. As a result, the substrate surface is modified to be hydrophilic and becomes free of the bubbles. The developer subsequently supplied through a developer supply nozzle uniformly spreads over the entire substrate surface without being obstructed by the bubbles, to avoid non-uniform development.

15 Claims, 5 Drawing Sheets

DEVELOPING METHOD AND APPARATUS

BACKGROUND OF THE INVENTION

1. Field of the Invention

The present invention relates to a developing method for developing a desired pattern exposed to a varied photosensitive resin film such as photoresist film for use in a photolithographic process, or photosensitive polyimide resin film acting as layer insulating film, which is formed on semiconductor wafers, glass substrates for photomasks, glass substrates for liquid crystal displays, substrates for optical disks or the like. More particularly, the invention relates to a developing method and apparatus including a prewetting process carried out prior to a developing process.

2. Description of the Related Art

In a conventional method of this type, a prewetting liquid is supplied before a developer (as disclosed in Japanese Patent Publication (Unexamine) No. 1982-136646, for example).

According to this developing method, a desired pattern is exposed to a substrate surface on which photoresist film has been formed, and thereafter the prewetting liquid such as an aqueous solution having a lower developing capability than the developer used is applied to the substrate surface. Then, the developer and a rinsing liquid are successively supplied to the substrate surface to obtain the pattern thereon. The prewetting liquid is supplied to the substrate surface to modify the hydrophobic property of the surface of photoresist film to be hydrophilic so that the developer applied to the surface of photoresist film may spread uniformly over the entire film surface.

The conventional method noted above has the following disadvantage.

When the prewetting liquid is supplied to the substrate surface, bubbles of minute sizes from several micrometers to several tens of micrometers are formed in the prewetting liquid, and these bubbles adhere to the surface of photoresist film. The developer supplied to the surface of photoresist film in this condition does not reach regions of the film adjacent the bubbles. As a consequence, a defective development occurs in such regions.

SUMMARY OF THE INVENTION

The present invention has been made having regard to the state of the art noted above, and a primary object of the invention is to provide a developing method and apparatus which effectively avoid non-uniformity of development.

The above object is fulfilled, according to the present invention, by a developing method for developing a desired pattern exposed to a substrate surface having a photosensitive resin film formed thereon, by successively supplying a prewetting liquid and a developer to the substrate surface, the method comprising the steps of:

supplying the prewetting liquid with ultrasonic waves applied thereto to the substrate surface to which the desired pattern has been exposed; and supplying the developer to the substrate surface after the prewetting liquid is supplied thereto.

According to the present invention, after a desired pattern is exposed to a substrate surface having a photosensitive resin film formed thereon, and before a developer is supplied, a prewetting liquid with ultrasonic waves applied thereto is supplied to the substrate surface. When the prewetting liquid is supplied to the substrate surface, minute bubbles are generated which adhere to the substrate surface. However, the ultrasonic application to the prewetting liquid readily causes the bubbles to float to the surface of the prewetting liquid, so that the substrate surface with the photosensitive resin film formed thereon becomes free of the bubbles. As a result, the developer subsequently supplied to the substrate surface uniformly spreads over the entire photosensitive resin film without being obstructed by the bubbles, to avoid non-uniform development.

A method different from the above method of the present invention is conceivable, in which ultrasonic waves are applied to the developer to be supplied, in order to vibrate and remove the minute bubbles adhering to the photoresist film. However, this method is undesirable for the following reason. Ultrasonic application inevitably increases temperature of the developer. As is well known, developer temperature is closely related to the precision of a developed pattern. Generally, therefore, the developer is kept under strict control to be within ±1° C. of a predetermined temperature. Thus, the developing method which removes minute bubbles by applying ultrasonic waves to the developer is undesirable in that it increases the developer temperature.

At the prewetting step of the present invention noted above, the prewetting liquid with the ultrasonic waves applied thereto, preferably, is directed downward to the substrate surface in horizontal rotation. However, the prewetting liquid with the ultrasonic waves applied thereto may be directed downward to the substrate surface maintained still in horizontal posture. It is also possible to immerse the substrate in the prewetting liquid with the ultrasonic wave applied thereto.

The prewetting liquid may be pure water or an aqueous solution diluting the developer, for example. Further, the prewetting liquid may preferably include a surface active agent.

The developing step may be executed after the prewetting liquid supply is stopped altogether, or may be started immediately before completion of the prewetting liquid supply so that the developing step and the prewetting step partly overlap each other. The partly overlapping steps will enable a smooth replacement of the prewetting liquid with the developer.

In a further aspect of the present invention, there is provided a developing apparatus for developing a desired pattern exposed to a substrate surface having a photosensitive resin film formed thereon, by successively supplying a prewetting liquid and a developer to the substrate surface, the apparatus comprising;

a substrate support for supporting a substrate having the substrate surface with the photosensitive resin film formed thereon and the desired pattern exposed thereto;

a prewetting liquid supplying device for supplying the prewetting liquid to the substrate surface;

an ultrasonic applying device for applying ultrasonic waves to the prewetting liquid; and a developer supplying device for supplying the developer to the substrate surface.

With this apparatus, the ultrasonic applying device applies ultrasonic waves to the prewetting liquid to be supplied from a nozzle of the prewetting liquid supplying device to the substrate surface. This ultrasonic application readily causes minute bubbles generated when the prewetting liquid is supplied to the substrate surface, to float to the surface of the prewetting liquid, so that the substrate surface with the photosensitive resin film formed thereon becomes free of the bubbles. As a result, the developer subsequently supplied to the substrate surface uniformly contacts the entire photosensitive resin film without being obstructed by the bubbles, to avoid nonuniform development.

It is preferred that, in the above apparatus:

the substrate support includes a spin support mechanism rotatable while supporting the substrate in horizontal posture;

the prewetting liquid supplying device includes a prewetting liquid supply nozzle disposed above the spin support mechanism for supplying the prewetting liquid to the substrate surface;

the ultrasonic applying device is mounted in the prewetting liquid supply nozzle; and the developer supplying device includes a developer supply nozzle disposed above the spin support mechanism for supplying the developer to the substrate surface.

Preferably, the prewetting liquid supply nozzle includes a cylindrical nozzle barrel communicating with a prewetting liquid supply pipe, and a tapered nozzle tip coupled to a lower end of the nozzle barrel; and the ultrasonic applying device includes a diaphragm having a piezoelectric or electrostriction effect, and a cable connected to the diaphragm for applying a high frequency voltage thereto, the diaphragm being mounted in the nozzle barrel to seal the nozzle barrel in a position slightly above a connection through which the nozzle barrel communicates with the prewetting liquid supply pipe.

At least a surface of the diaphragm for contacting the prewetting liquid, preferably, is coated with tantalum to improve durability of the diaphragm.

It is not absolutely necessary to provide the separate prewetting liquid supply nozzle and developer supply nozzle. A single common nozzle may be used to supply the prewetting liquid and developer successively.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENT

A preferred embodiment of the present invention will be described in detail hereinafter with reference to the drawings.

Figure 1:
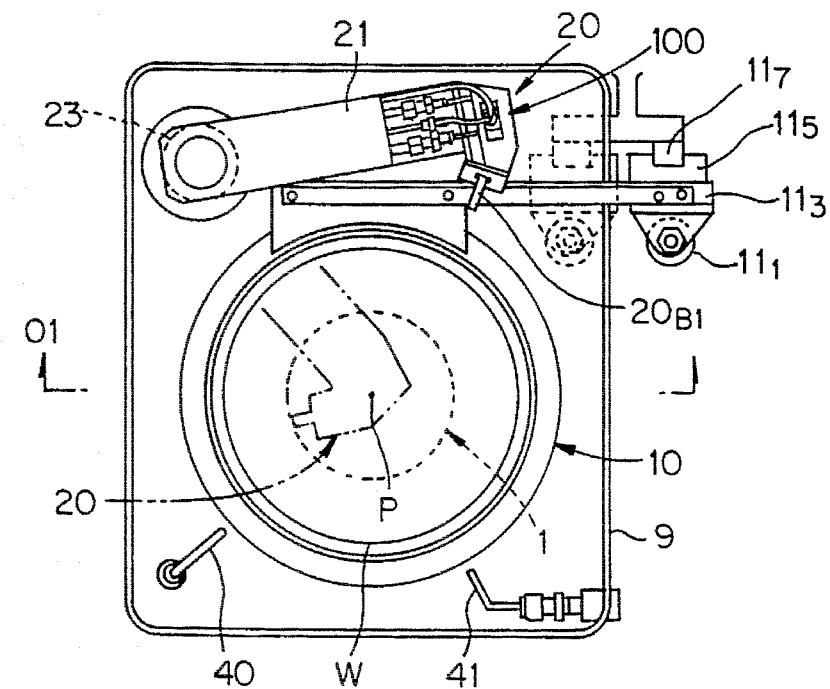
FIG. 1 is a plan view of a substrate spin developing apparatus according to the present invention.
Figure 4:
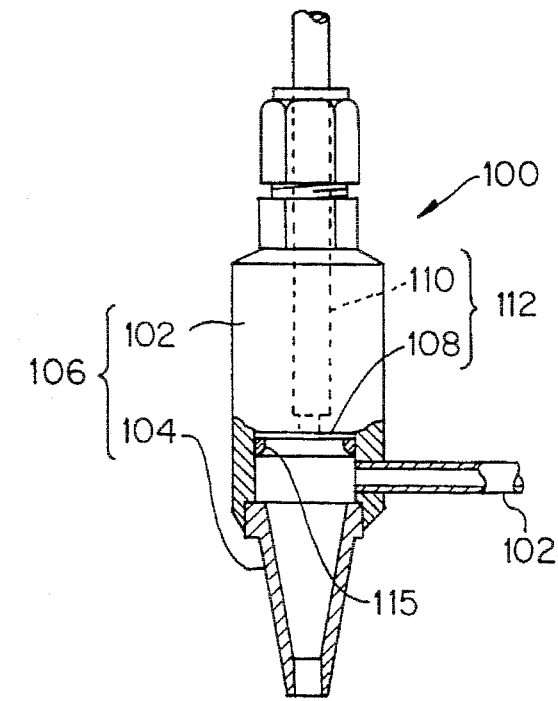
FIG. 4 is a view, partly in section, of a prewetting liquid supply nozzle of the developing apparatus.
Figure 2:
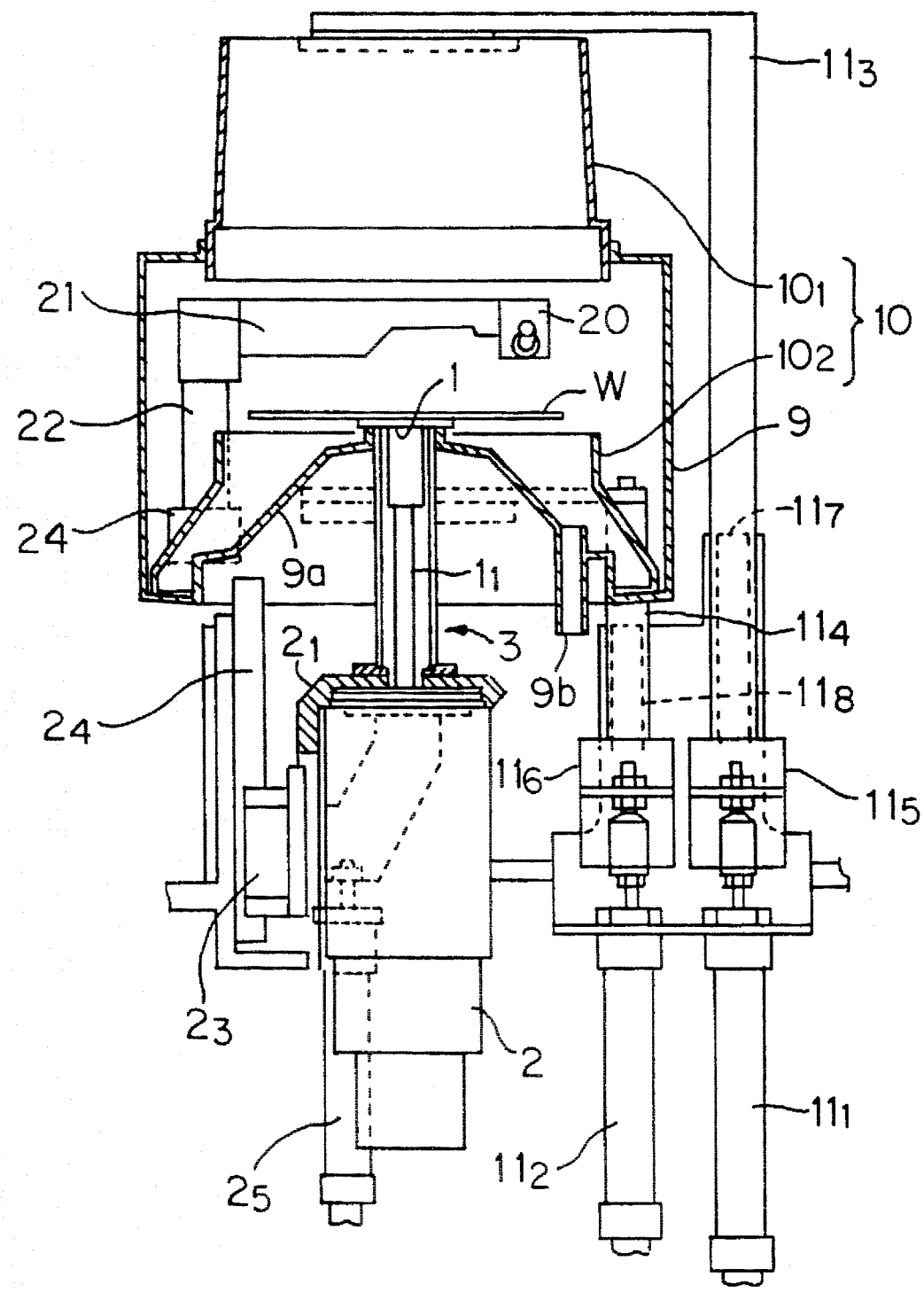
FIG. 2 is a section taken on line 01—01 of FIG. 1.
Figure 3A:
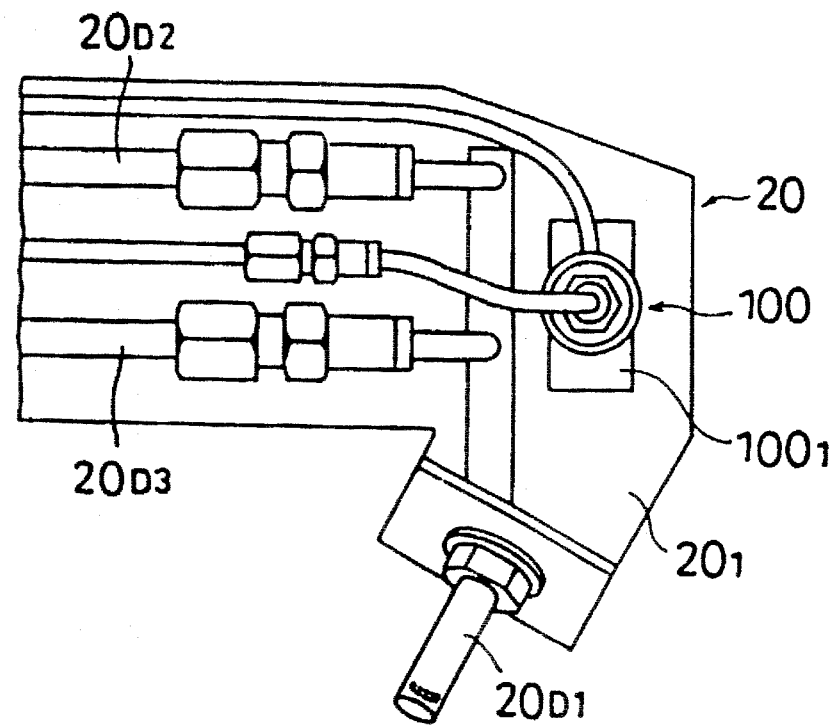
FIGS. 3A and 3B are enlarged views of a treating liquid supply nozzle assembly of the developing apparatus.
Figure 3B:
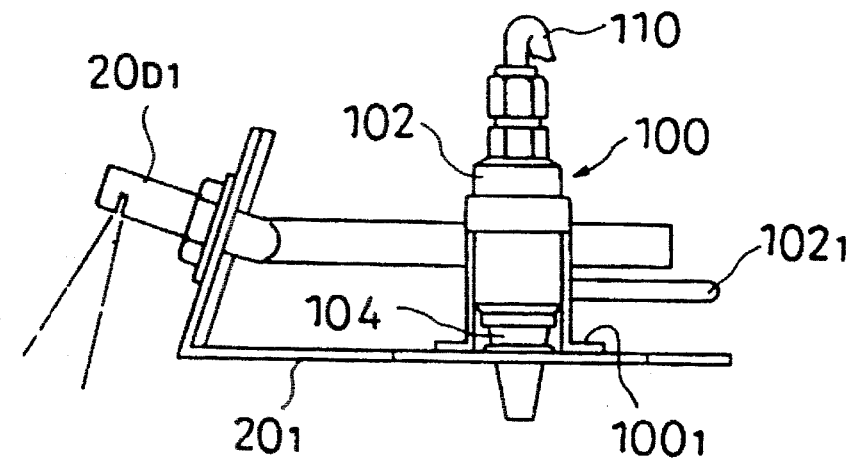

FIG. 1 is a plan view of a substrate spin developing apparatus according to the present invention. FIG. 2 is a section taken on line 01—01 of FIG. 1. FIGS. 3A and 3B are enlarged views of a treating liquid supply nozzle assembly. FIG. 4 is a view, partly in section, of a prewetting liquid supply nozzle.

The substrate spin developing apparatus includes a suction type spin chuck 1 for supporting a substrate or wafer W in a substantially horizontal posture, and a motor 2 for spinning the chuck 1. The chuck 1 and motor 2 constitute a spin treating device 3. The apparatus further includes a cup assembly 10 surrounding the spin chuck 1 to prevent scattering of treating liquids, and a nozzle assembly 20 driven to sweep over the wafer W supported on the spin chuck 1 for supplying a prewetting liquid and a developer to the wafer W.

The spin chuck 1 is connected to the motor 2 through a hollow rotary shaft $1_1$. The motor 2 is attached to a support frame $2_1$. The support frame $2_1$ has a guide $2_3$ fixed thereto and slidably fitted on a vertical guide rail $2_4$. The support frame $2_1$ is connected to a rod of an air cylinder $2_5$ extendible and contractible vertically. When the air cylinder $2_5$ is driven, the spin chuck 1 is reciprocated between a transfer position for transferring the wafer W to and from a transport mechanism not shown, and a treating position in which the treating liquids are supplied to the wafer W supported on the spin chuck 1.

The cup assembly 10 for preventing scattering of the treating liquids includes an upper cup $10_1$ and a lower cup $10_2$ which are vertically separable from each other. The two cups $10_1$ and $10_2$ are mounted in a box-like outer cup 9 having a pan 9a as an integral part thereof for collecting the treating liquids. An exhaust duct 9b is connected to a bottom of the pan 9a for exhausting solvents or the like evaporating from the treating liquids. The exhaust duct 9b is decompressed by a suction source.

The upper cup $10_1$ and lower cup $10_2$ are vertically movable independently of each other by separate air cylinders $11_1$ and $11_2$. The upper cup $10_1$ is separated from the lower cup $10_2$ when the developer or prewetting liquid is supplied to the wafer W. FIG. 2 shows the upper cup $10_1$ in a separated position at a predetermined height. The lower cup $10_2$ has an upper end thereof disposed below a wafer supporting surface of the spin chuck 1.

The upper cup $10_1$ is attached at an upper end thereof to a support arm of an inverted L-shape support $11_3$. The support $11_3$ has a post connected to a rod of the air cylinder $11_1$ through a vertically movable guide $11_5$ slidably fitted on a guide rail $11_7$. Similarly, the lower cup $10_2$ is vertically movably supported by a support $11_4$, a vertically movable guide $11_6$ and a guide rail $11_8$.

The nozzle assembly 20 for supplying the prewetting liquid and developer is disposed between the upper cup $10_1$ and lower cup $10_2$. The nozzle assembly 20 is attached to a distal end of an arm 21, a proximal end of which is horizontally pivotably attached to an upper position of a post 22 through a support shaft 23. A drive motor 24 is disposed at a lower end of the post 22 for causing the arm 21 to pivot horizontally and move the nozzle assembly 20 over the wafer W. The arm 21 is horizontally pivotable to locate the nozzle assembly 20 substantially centrally of the wafer W supported on the spin chuck 1 (see FIG. 1).

Numeral 40 in FIG. 1 denotes a supply nozzle for supplying a rinsing liquid to the wafer W. Numeral 41 denotes a nozzle for supplying nitrogen gas to blow dust away from the wafer W.

Reference is now made to FIGS. 3A and 3B which are enlarged views of the nozzle assembly 20 for supplying the treating liquids. FIG. 3A is a plan view and FIG. 3B is a side view of the nozzle assembly 20.

The nozzle assembly 20 includes a developer supply nozzle $20_{D1}$ for supplying the developer to the surface of wafer W, and a prewetting liquid supply nozzle 100 for supplying the prewetting liquid thereto. The developer supply nozzle $20_{D1}$ is connected to a pipe $20_{D2}$ for supplying pure water, and a pipe $20_{D3}$ for supplying the developer. One of the pipes $20_{D2}$ and $20_{D3}$ is selected to supply pure water or developer through the developer supply nozzle $20_{D1}$. The developer supply nozzle $20_{D1}$ is attached, with a forward end thereof directed upward, to an end of a nozzle support $20_1$ bent over to form an acute angle. The nozzle $20_{D1}$ supplies the developer or pure water as spread in a sector shape in plan view.

Reference is made to FIG. 4 which is an enlarged view of the prewetting liquid supply nozzle 100.

The prewetting liquid supply nozzle 100 includes a nozzle body 106, an ultrasonic applying unit 112 and a prewetting liquid supply pipe $102_1$. The nozzle body 106 has a cylindrical nozzle barrel 102, and a nozzle tip 104 screwed tight into a lower opening thereof. The ultrasonic applying unit 112 has a diaphragm 108 mounted in the nozzle body 106, and a cable 110 connected to the diaphragm 108. The pipe $102_1$ supplies the prewetting liquid into the nozzle barrel 102 through a side wall thereof.

The nozzle barrel 102 is formed of a metal such as stainless steel which is corrosion resistant to the prewetting liquid. The nozzle tip 104 is formed of a polymeric resin such as polypropylene. The nozzle tip 104 has a tapered passage defining an end opening of circular cross section.

The diaphragm 108 mounted in a hollow portion of the nozzle barrel 102 comprises a material having a piezoelectric or electrostriction effect and shaped to produce a desired mechanical resonance frequency (e.g. a frequency called ultrasonic which is approximately 1.5 MHz). This material may have a crystal structure producing a high piezoelectric effect, or may be lead titanate or zirconate ceramic producing a high electrostriction effect. The diaphragm 108 employed in this embodiment is formed of ceramic with tantalum coated on one surface thereof exposed to the prewetting liquid in order to prolong life. This tantalum-coated ceramic diaphragm 108 is attached through a packing 115 to an inner wall of the nozzle barrel 102. The cable 110 applies to the diaphragm 108 a high frequency voltage of approximately 1.5 MHz corresponding to the mechanical resonance frequency of the diaphragm 108. The diaphragm 108 thereby excited generates a vibration corresponding to the high frequency voltage applied thereto. This ultrasonic vibration is applied to the prewetting liquid supplied through the prewetting liquid supply pipe $102_1$.

The prewetting liquid with the ultrasonic application could damage photoresist film formed on the surface of wafer W, depending on film thickness and type of photoresist. It is therefore desirable to apply to the diaphragm 108 a high frequency voltage of appropriate amplitude according to the film thickness and type of photoresist used.

As shown in FIG. 3B, the prewetting liquid supply nozzle 100 is mounted on the nozzle support $20_1$, with the nozzle tip 104 projecting through a perforation thereof toward the wafer W, and the nozzle barrel 102 fixed substantially upright by an anchoring device $100_1$.

A developing process by the substrate spin developing apparatus having the above construction will be described next with reference to FIGS. 5A through 5E. The wafer to be treated has photoresist film already formed and cured at a predetermined temperature (by so-called soft baking) on a surface thereof, with a desired pattern exposed to the film subsequently.

<Wafer Intake>

The air cylinder $2_5$ is extended to raise the spin chuck 1 to the transfer position for the spin treating device 3 to receive the wafer W to be treated. After the wafer W is transferred from the transport mechanism not shown to the spin treating device 3, the air cylinder $2_5$ is contracted to lower the spin chuck 1 to the treating position (FIG. 5A).

<Prewetting Treatment>

Figure 5A:
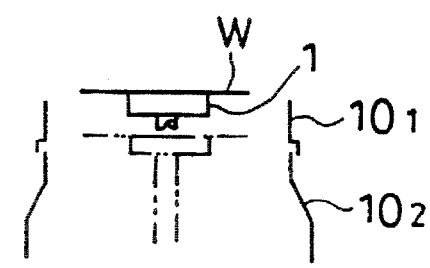
FIGS. 5A through 5E are schematic views showing a developing process.

The air cylinder $11_1$ is extended to separate the upper cup $10_1$ from the lower cup $10_2$ and raise the upper cup $10_1$ to the predetermined height (FIG. 5A and FIG. 2). Nitrogen gas is blown from the nitrogen supply nozzle 41 between the two cups $10_1$ and $10_2$ to the surface of wafer W to remove dust and the like therefrom. Next, the drive motor 24 is rotated forward to drive the arm 21, whereby the arm 21 pivots to and stops at a position to locate the prewetting liquid supply nozzle 100 over the center of spin P of the wafer W as shown in a two-dot-and-dash line in FIG. 1.

Figure 5B:
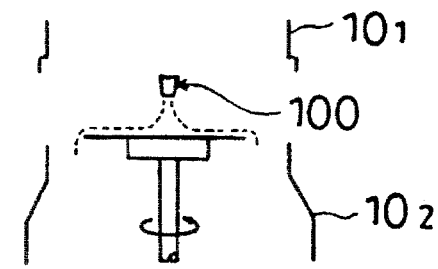

The wafer W is spun by the motor 2 in forward rotation at a rate of 300 to 1000 rpm, preferably about 300 rpm. At this time, pure water is supplied as the prewetting liquid in a flow rate of 0.6 to 1.0 lit./min. through the prewetting liquid supply pipe $102_1$. The high frequency voltage of approximately 1.5 MHz is applied to the diaphragm 108 in the prewetting liquid supply nozzle 100 then. Thus, the prewetting liquid with ultrasonic vibration is supplied from the nozzle tip 104 to the wafer W. As a result, minute bubbles formed when the prewetting liquid impinges upon the surface of wafer W float on the prewetting liquid on the wafer surface instead of adhering to the wafer surface. The minute bubbles will not remain on the wafer surface having photoresist film formed thereon. This prewetting treatment is effected for 5 to 10 seconds, preferably about 5 seconds, before stopping the prewetting liquid supply (FIG. 5B).

The wafer W may be maintained still instead of being rotated during the prewetting liquid supply. The drive motor 24 may cause the nozzle assembly 20 to pivot horizontally while supplying the prewetting liquid.

<Developing Treatment>

Figure 5C:
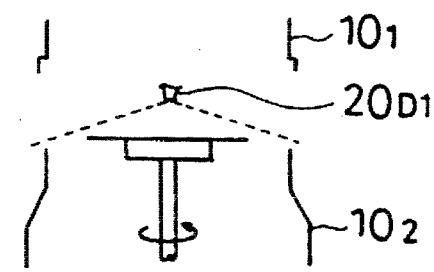

While the motor 2 spins the wafer W at approximately 30 rpm, the developer appropriate to the photoresist is supplied at a flow rate of 0.6 to 0.8 lit./min. through the developer pipe $20_{D3}$, and from the developer supply nozzle $20_{D1}$ to the surface of wafer W. At this time, the drive motor 24 causes the arm 21 to pivot horizontally to supply the developer over the entire surface of wafer W (FIG. 5C). Through the prewetting treatment described above, the surface of wafer W has been changed from hydrophobic to hydrophliic, with no bubbles remaining thereon. Thus, the developer quickly spreads over the entire wafer surface. A smaller quantity of developer is required to cover the entire wafer surface than when minute bubbles are present thereon.

The developer supply is stopped in a few seconds. To allow developing action of the developer supplied to the surface of wafer W, the wafer W is spun at the above rotating rate twice, for a few seconds each time, during a predetermined developing time (e.g. 50 seconds). Alternatively, the developing action may be allowed to take place while the wafer W is maintained still. In the absence of minute bubbles obstructive to contact between the developer and wafer surface, the developer is supplied over the entire wafer surface to secure uniform development.

The developer supply may be started immediately before completion of the prewetting liquid supply, so that the developing treatment partly overlaps the prewetting treatment. This assures a smooth replacement of the prewetting liquid with the developer. For example, the developer supply may be started about 0.1 second before completion of the prewetting liquid supply.

<Rinsing Treatment>

Figure 5D:
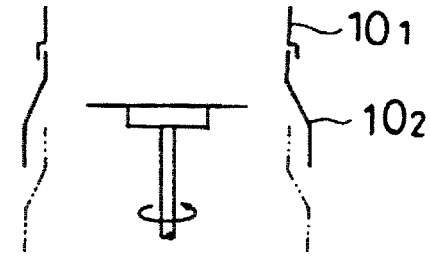

The above developing action is stopped. The drive motor 24 moves the arm 21 outside the cup assembly 10. Then, the air cylinder 11$_2$ is extended to join the lower cup 10$_2$ to the upper cup 10$_1$. In this state, as shown in FIG. 5D, the lower cup 10$_2$ has an inclined inner surface thereof level with the wafer supporting surface of the spin chuck 1.

While the motor 2 spins the wafer W at approximately 1000 rpm, the rinsing liquid supply nozzle 40 directs the rinsing liquid to the wafer surface at a flow rate of 0.6 to 0.8 lit./min. This treatment is continued for 10 to 15 seconds, for example.

Before the above rinsing liquid supply, pure water may be supplied through the pure water pipe 20D2 on the arm 21, and from the developer supply nozzle 20D1 to the surface of wafer W, roughly to wash the developer off the wafer surface and to purge the developer from the developer supply nozzle 20D1 at the same time.

<Drying Treatment>

After the series of treatments described above, the surface of wafer W is dried. The motor 2 spins the wafer W at a high velocity of 4000 to 5000 rpm for 10 to 15 seconds to scatter the rinsing liquid away from the surface of wafer W. The surface of water W dries as a result.

Figure 5E:
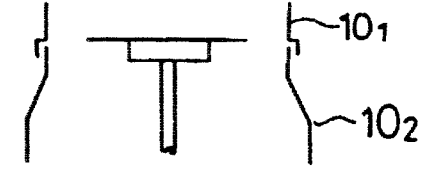

The air cylinders 11$_1$ and 11$_2$ are contracted to lower the upper cup 10$_1$ and lower cup 10$_2$ together to a treatment ending position (FIG. 5E). Wafers may be treated successively by repeating the above series of treatments.

Other liquids than pure water may be used as the prewetting liquid. These liquids include the developer diluted with pure water to decrease its developing capability, such as an alkalescent aqueous solution or a surface active agent for a positive type photoresist.

Figure 6A:
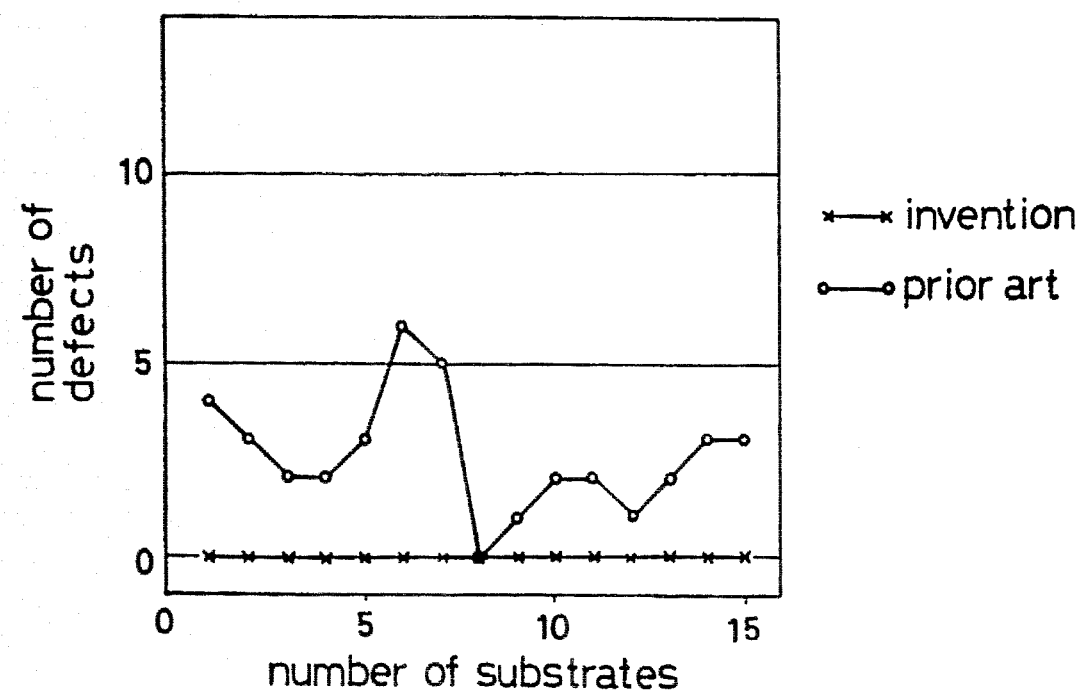
FIGS. 6A and 6B are graphs comparing a conventional developing method and the developing method according to the present invention.
Figure 6B:
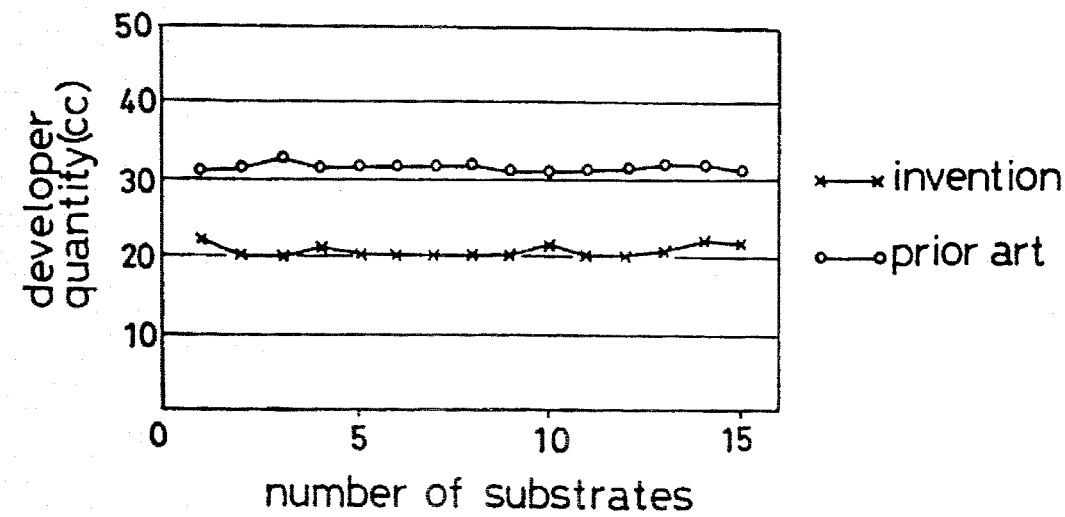

Next, reference is made to FIGS. 6A and 6B for a comparison between a conventional developing method and the developing method according to the present invention.

FIG. 6A is a graph showing counts of defects having sizes of 0.2 μm and larger due to minute bubbles. The defects were counted, using a flaw testing device, after the developing process to develop a desired pattern on photoresist film tight on wafers, and a heat-treatment (i.e. post-baking) of the wafers to enhance stability for a subsequent etching process. The sample wafers were of six-inch size, the photoresist film was approximately 1.2 μm thick, the soft baking was carried out at 90° C. for 50 seconds, and the post-baking at 120° C. for 50 seconds.

As shown in FIG. 6A, no defects resulted from the developing method with the ultrasonic prewetting treatment according to the present invention. On the other hand, the developing method with a conventional prewetting treatment produced a maximum of six defects. In the refined semiconductor process today, patterns are often designed on the order of submicrons not exceeding 1 μm, and defects as large as 0.2 μm could seriously affect yields of semiconductor elements. The developing method according to the present invention effectively prevents non-uniformity of development, thereby increasing yields of semiconductor elements.

FIG. 6B is a graph showing quantities of the developer used to cover the entire wafer surfaces without being repelled, i.e. minimum quantities of developer required for development, when the developer is supplied to wafer surfaces having photoresist film formed thereon.

As shown in FIG. 6B, the developing method with the conventional prewetting treatment requires approximately 30 cc of developer. The developing method with the ultrasonic prewetting treatment according to the present invention requires approximately 20 cc of developer, saving about 30% of the developer quantity. This is due to the fact that minute bubbles are eliminated from the wafer surfaces by the ultrasonic application, thereby to improve wettability to the developer of the wafer surfaces having the photoresist film formed thereon, allowing the developer to spread over the wafer surfaces without obstacles. With less quantities of the developer used in the developing process, the developing apparatus is operable at reduced running cost.

The present invention is not limited to the substrate spin developing apparatus. The invention is applicable to various developing methods (e.g. a dip type developing method in which substrates are immersed in treating liquids) as long as a developer is applied to substrate surfaces having photosensitive resin film formed thereon.

In the foregoing embodiment, the prewetting liquid and developer are supplied through separate nozzles. These treating liquids may be supplied through a single common nozzle with an ultrasonic generating diagram mounted therein. In this case, when the prewetting liquid is supplied through the common nozzle, the diaphragm is excited to apply ultrasonic waves to the prewetting liquid. Subsequently, the developer is supplied through the nozzle with the diaphragm put out of operation.

The present invention may be embodied in other specific forms without departing from the spirit or essential attributes thereof and, accordingly, reference should be made to the appended claims, rather than to the foregoing specification, as indicating the scope of the invention.

What is claimed is:

1. A developing apparatus for developing a desired pattern exposed to a substrate surface having a photosensitive resin film formed thereon, by successively supplying a prewetting liquid and a developer to the substrate surface, said apparatus comprising:

substrate support means for supporting a substrate having said substrate surface with said photosensitive resin film formed thereon and said desired pattern exposed thereto;

prewetting liquid supply means for supplying said prewetting liquid to said substrate surface and thereby and thereby changing the substrate surface from hydrophobic to hydrophilic;

ultrasonic applying means for applying ultrasonic waves to said prewetting liquid; and developer supplying means for supplying said developer to said substrate surface; wherein;

said substrate support means includes a spin support mechanism rotatable while supporting said substrate in horizontal posture;

said prewetting liquid supply means includes a prewetting liquid supply nozzle disposed above said spin support mechanism for supplying said prewetting liquid to said substrate surface;

said ultrasonic applying means is mounted in said prewetting liquid supply nozzle;

said developer supply means includes a developer supply nozzle disposed above said spin support mechanism for supplying said developer to said substrate surface; and said prewetting liquid supply means and said developer supply means are driven horizontally to a position above the spin support mechanism.

2. An apparatus as defined in claim 1, wherein:

said prewetting liquid supply nozzle includes a cylindrical nozzle barrel communicating with a prewetting liquid supply pipe, and a tapered nozzle tip coupled to a lower end of said nozzle barrel; and said ultrasonic applying means includes a diaphragm having a piezoelectric or electrostriction effect, and a cable connected to said diaphragm for applying a high frequency voltage thereto, said diaphragm being mounted in said nozzle barrel to seal said nozzle barrel in a position slightly above a connection through which said nozzle barrel communicates with said prewetting liquid supply pipe.

3. An apparatus as defined in claim 2, wherein at least a surface of said diaphragm for contacting said prewetting liquid is coated with tantalum.

4. An apparatus for developing a desired pattern exposed to a substrate surface having a photosensitive resin film formed thereon, using a prewetting liquid and a developer, comprising;

substrate support for supporting a substrate having said substrate surface;

ultrasonic applicator for ultrasonically vibrating said prewetting liquid;

prewetting liquid supply for applying said ultrasonically vibrated prewetting liquid to said substrate surface; and developer supply for applying said developer to said substrate surface after application of at least a portion of said ultrasonically vibrated prewetting liquid to said substrate surface.

5. A developing apparatus according to claim 4, wherein said substrate support is adapted to support said substrate in a stationary position during application of said prewetting liquid to said substrate surface.

6. A developing apparatus according to claim 4, wherein said prewetting liquid supply and said developer supply are adapted to respectively apply said prewetting liquid and said developer to said substrate surface simultaneously.

7. A developing apparatus according to claim 4, wherein said prewetting liquid supply and said developer supply are adapted to respectively apply said prewetting liquid and said developer to said substrate surface simultaneously during approximately the final 0.1 second of application of said prewetting liquid.

8. A developing apparatus according to claim 4, wherein said substrate support is adapted to support said substrate so that said substrate surface is in a plane and said prewetting liquid supply is adapted to supply said prewetting liquid orthogonal to said plane.

9. A developing apparatus according to claim 4, wherein said prewetting liquid supply and said developer supply have a common nozzle.

10. A developing apparatus according to claim 4, wherein said prewetting liquid supply includes a nozzle and is adapted to horizontally pivot said nozzle during application of said prewetting liquid to said substrate surface.

11. A developing apparatus according to claim 4, wherein said prewetting liquid supply is adapted to apply said prewetting liquid to said substrate surface for a time period within a range of approximately 5 seconds to approximately 10 seconds.

12. A developing apparatus according to claim 4, wherein said substrate support is adapted to support said substrate in a stationary position during application of said developer to said substrate surface.

13. A developing apparatus according to claim 4, wherein said application of said ultrasonically vibrated prewetting liquid to said substrate surface changes the substrate surface from hydrophobic to hydrophilic.

14. An apparatus for developing a desired pattern exposed to a surface of a substrate having a photosensitive resin film formed thereon, using a prewetting liquid and a developer comprising;

ultrasonic applicator for ultrasonically vibrating said prewetting liquid;

prewetting liquid applicator for transferring said ultrasonically vibrated prewetting liquid to said substrate surface; and developer applicator for transferring said developer to said substrate surface after application of said ultrasonically vibrated prewetting liquid to said substrate surface.

15. A developing apparatus according to claim 14, wherein said transfer of said ultrasonically vibrated prewetting liquid to said substrate surface changes the substrate surface from hydrophobic to hydrophilic.

* * * * *